United States Patent [19]

Wei et al.

[11] Patent Number: 4,942,449
[45] Date of Patent: Jul. 17, 1990

[54] FABRICATION METHOD AND STRUCTURE FOR FIELD ISOLATION IN FIELD EFFECT TRANSISTORS ON INTEGRATED CIRCUIT CHIPS

[75] Inventors: Ching-Yeu Wei; Patricia A. Piacente, both of Schenectady; Henry H. Woodbury, Scotia, all of N.Y.

[73] Assignee: General Electric Company, Schenectady, N.Y.

[21] Appl. No.: 173,918

[22] Filed: Mar. 28, 1988

[51] Int. Cl.$^5$ .............................................. H01L 29/34
[52] U.S. Cl. ........................................ 357/54; 357/49; 357/23.11; 437/69
[58] Field of Search .................. 357/54, 49, 23.11; 437/69; 148/33.3

[56] References Cited

U.S. PATENT DOCUMENTS

| | | | |
|---|---|---|---|
| 4,104,086 | 8/1978 | Bondur et al. | 357/49 |
| 4,333,965 | 6/1982 | Chow et al. | 427/93 |
| 4,642,878 | 2/1987 | Maeda | 437/69 |
| 4,743,566 | 5/1988 | Bastiaens et al. | 357/23.11 |
| 4,842,675 | 6/1989 | Chapman et al. | 437/69 |

FOREIGN PATENT DOCUMENTS 55-166959 12/1980 Japan ............................ 357/23.11

OTHER PUBLICATIONS

RCA Technical Note by Woo et al., Nov. 27, 1979.
R. Jerdonek et al., "Reduced Geometry CMOS Technology", *International Electron Devices Meeting*, Tech. Digest, pp. 450-453, 1982.
C-Y. Wei et al., "Modeling of Radiation-Induced Leakage Currents of NMOS FETs with LOCOS Field Isolation", *IEEE* 1987 *NSREC*, Snowmass, Colorado, Jul., 1987.
P. J. Tsang et al., "Fabrication of High Performance LDDFET's with Oxide Sidewall-Spacer Technology", *IEEE Trans. Electron Devices*, vol. ED-29, pp. 590-596, Apr. 1982.
K. Kurosawa et al., "A New Bird's-Beak Free Field Isolation Technology for VLSI Devices", *Int. Electron Devices Meeting*, 1981, pp. 384-387.
T. Shibata et al., "A Simplified BOX (Buried Oxide) Isolation Technology for Megabit Dynamic Memories", *Int. Electron Devices Meeting*, Dec. 1983, pp. 27-30.
K. Kasama et al., "A Radiation-Hard Insulator for MOS LSI Device Isolation", *IEEE Trans. Nuc. Sci.*, Dec., 1985, pp. 3965-3970.
K. Watanabe et al., "Radiation Hardened Silicon Devices Using a Novel Thick Oxide", *IEEE Trans. Nuc. Sci.*, Dec., 1985, pp. 3971-3974.

*Primary Examiner*—Andrew J. James
*Assistant Examiner*—Mark Prenty
*Attorney, Agent, or Firm*—Marvin Snyder; James C. Davis, Jr.

[57] ABSTRACT

A method for forming a field oxide isolation region for a field effect transistor for use in integrated circuit chip devices includes process steps which preserve planarity while at the same time providing an increased degree of radiation hardness. The bird's beak region of the device is provided with both thermally grown and deposited oxide layers in a planarity preserving process.

5 Claims, 3 Drawing Sheets

FABRICATION METHOD AND STRUCTURE FOR FIELD ISOLATION IN FIELD EFFECT TRANSISTORS ON INTEGRATED CIRCUIT CHIPS

BACKGROUND OF THE INVENTION

The present invention generally relates to a method and a structure for forming relatively planar field isolation structures in field effect transistor (FET) devices. More particularly, the present invention is directed to an insulation configuration in the bird's beak region of field effect transistors so as to include a thin layer of silicon oxide which is formed thermally over which a thicker layer of insulative material is present so as to provide a high degree of radiation hardness.

In the fabrication of field effect transistors on integrated circuit chips, it is necessary to provide an active region typically comprising a doped semiconductor body such as n-doped silicon. This doping may be disposed uniformly throughout the silicon substrate. In other situations, it is desirable to also employ pockets of p-doped well regions, as for example, in the fabrication of CMOS (complementary metal-oxide-semiconductor) devices. Active regions in the semiconductor substrates must be provided with means for insulating various devices on the circuit chip from one another. This insulative function is provided by regions of silicon oxide formed on the substrate. This oxide is referred to as the field oxide.

As device sizes have shrunk, the desire and necessity for not increasing the number of processing steps used in integrated circuit fabrication has persisted since each step carries with it the possibility of defect formation or contamination. Furthermore, particularly with respect to masking steps, it is desirable to employ as few masking operations as possible to avoid problems of registration and alignment which become critical, particularly when feature sizes below 1 micron in line width are present. Accordingly, processes for integrated circuit manufacture must be designed with these restrictions in mind.

In the formation of field oxide regions, there is a transition region between active doped silicon areas (the active regions) and the relatively thick field oxide which surrounds the active areas. This region is referred to as the bird's beak region owing to its shape, particularly when viewed from a cross-sectional direction along a planar cut perpendicular to the substrate surface. It is the problems which are associated with the bird's beak region to which the present invention is particularly directed. More particularly, it has been found that radiation entering the bird's beak region produces undesirable electrical effects. This problem has increased as device size has shrunk and is a particular problem in memory circuits which are generally densely packed on a chip and which are adversely affected by stray radiation, even background radiation such as that found in earth orbit satellite situations. Accordingly, it is seen that it is very desirable to be able to provide a radiation hard structure in the bird's beak region of field effect transistors employed in very large scale integrated circuit chip devices. It is also desirable to be able to provide a radiation hard structure and method while at the same time maintaining device planarity and without adversely increasing the number of processing steps that are required, particularly masking steps.

SUMMARY OF THE INVENTION

In accordance with one embodiment of the present invention, a method for forming field oxide regions in field effect transistors on integrated circuit chips is provided. In this method, an oxidation barrier is deposited on a silicon substrate which has a substantially planar surface. The oxidation barrier effectively operates to define the active region beneath the barrier. The silicon is then thermally oxidized and in this process, expands so as to form relatively thick silicon oxide regions around the oxidation barrier. The thermally formed silicon oxide extends at least below the planar surface and in the process of oxidation, a sloped boundary between silicon and silicon oxide is provided in the proximity of the barrier edges. The oxidation barrier is then removed and the thermally formed silicon oxide is partially etched to a point below the surface of the silicon substrate so as to expose silicon which was beneath the barrier, including silicon which forms a portion of the sloped boundary. Next, a thin layer of silicon oxide is formed by thermal oxidation over exposed silicon including the sloped boundary and also, to some extent, over the remaining thermally formed silicon oxide. Next, a deposited layer of silicon oxide is provided over the entire workpiece. Lastly, the deposited and thermally grown silicon oxide over the active region is removed, as by masking and etching. The significant results of this process are the formation of a substantially planar field isolation configuration for a field effect transistor in which the so-called bird's beak region of the device is seen to possess both a relatively thin layer of thermally grown silicon oxide over which is present a layer of relatively thicker deposited silicon oxide. It is the presence of the deposited and thermally grown silicon oxides in the bird's beak region which provides the radiation hardness of the present invention.

In accordance with another embodiment of the present invention, a field isolation structure for field effect transistors includes a doped silicon region which exhibits a (relatively) raised, substantially planar central region having sidewalls which slope downwardly away from the central region. A thick layer of thermally grown silicon oxide is disposed around the central region and is tapered to a thin thermally grown silicon oxide layer along at least a portion of the sloping sidewall of the silicon region. A layer of deposited silicon oxide is present over the thermally grown silicon oxide, particularly along the sloping sidewall. It is particularly desirable that a dual layer oxide structure is present in the bird's beak region (as defined more particularly below). The structure that is present is both substantially planar and radiation hard in the sense that the resulting field effect transistor structure is relatively immune to ionizing radiation effects.

Accordingly, it is seen that it is an object of the present invention to provide field isolation structures for field effect transistors so as to provide a degree of radiation hardness for the device.

It is also an object of the present invention to provide a field effect transistor device which is not only radiation hard, but which is also substantially planar, the latter characteristic being particularly desirable in structuring multilayer circuits and forming interconnection metal layers.

It is a still further object of the present invention to provide a method for the fabrication of substantially planar and radiation hard field effect transistor devices.

It is also an object of the present invention to provide a method for field effect transistor fabrication which does not depart significantly from conventionally employed processing methodologies.

It is yet another object of the present invention to provide a method for the fabrication of field effect transistor devices employing as few masking steps as possible.

It is a still further object of the present invention to provide a method for transistor fabrication which is simple, reliable and does not require critical masking steps or a large plurality of unit process steps.

It is a still further object of the present invention to provide a method for fabricating field effect transistor devices for very large scale integrated circuit chips incorporating devices having feature sizes less than about 1 micron.

Lastly, but not limited hereto, it is an object of the present invention to provide a method for the formation of both deposited and thermally grown silicon oxide layers in the bird's beak region of field effect transistor devices.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
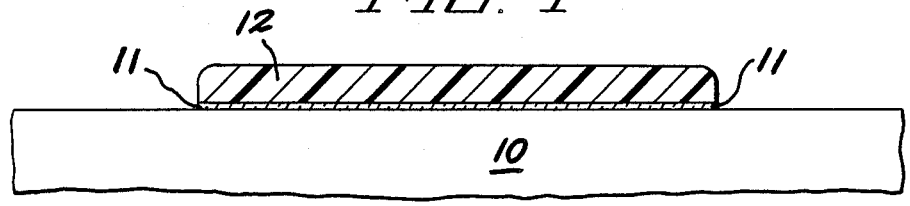
FIG. 1 is a cross-sectional side elevation view illustrating an initial step in the process of the present invention in which an oxidation barrier is deposited.

FIG. 1 illustrates an initial step in a process in accordance with a preferred embodiment of the present invention. In particular, FIG. 1 shows silicon substrate 10 on which an oxidation barrier has been deposited. This oxidation barrier is deposited and patterned in accordance with conventional methods. The oxidation barrier defines what is to be the active region of a field effect transistor device. It is also noted that substrate 10 possesses a substantially planar surface and may in fact comprise silicon material doped with a particular polarity dopant. The oxidation barrier preferably comprises a layer 11 of silicon oxide over which is disposed a coextensive layer of silicon nitride 12. For example, in one embodiment of the present invention, substrate 10 comprises a $N/N^+$ epitaxial wafer. Processing typically begins with the growth of a thin layer of stress relief oxide 11 followed by low pressure chemical vapor deposition of silicon nitride. The workpiece is then masked with photoresist so as to selectively define the field oxide regions and then the overlying silicon nitride layer is etched to define the active regions. The resulting structure is seen in cross-sectional view in FIG. 1.

Figure 2:
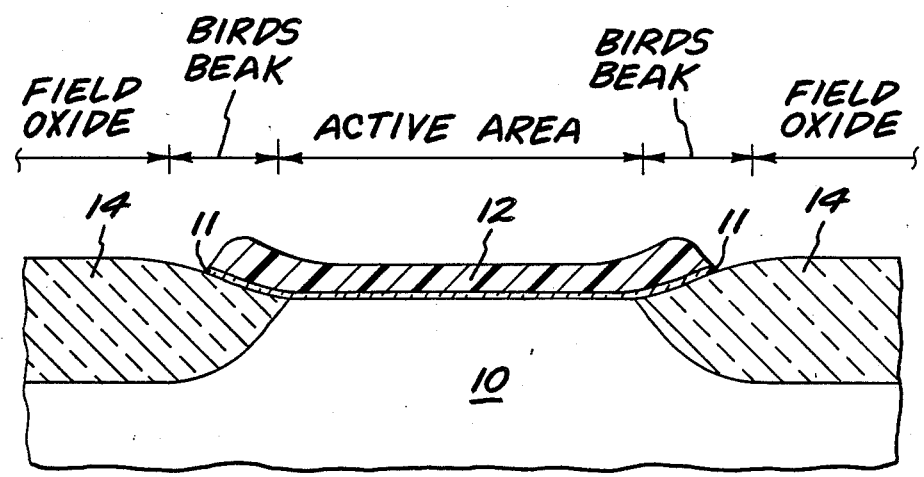
FIG. 2 is a cross-sectional side elevation view similar to FIG. 1 showing the result of forming a thermally grown oxide layer and in particular, illustrating what is generally referred to as the bird's beak region of a field effect transistor device.

After the silicon nitride is patterned to define the active areas, the photoresist material is removed and an approximately 1 micron thick field oxide layer is thermally grown. This results in the formation of silicon oxide regions 14 as seen in FIG. 2. It is noted that during oxidation of the silicon substrate, the oxide of silicon swells so as to take up more room. This results in relatively thick silicon oxide regions at distal locations from the oxidation barrier edges and a tapered silicon oxide region extending, to a small extent, beneath the edges of the oxidation barrier 12. This results in the formation of a sloped boundary between silicon 10 and silicon oxide 14 in the region referred to as the bird's beak region in FIG. 2. This region is given its name as a result of the cross-sectional shape indicated in FIG. 2. The formation of silicon oxide region 14 is preferably carried out in an atmosphere of steam and oxygen at a temperature between approximately 800° C. and 1,000° C.

Figure 3:
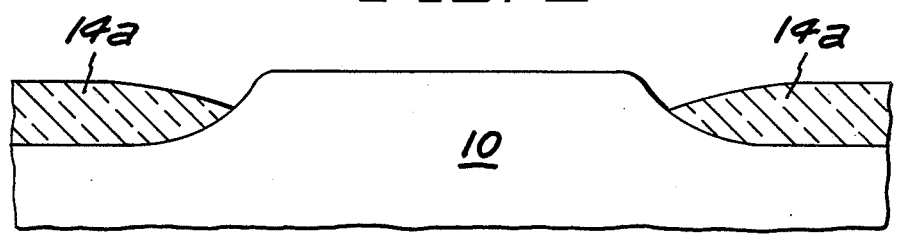
FIG. 3 is a view similar to FIG. 2, but more particularly illustrating the result occurring upon the removal of the oxide barrier and upon a partial removal of the thermally grown silicon oxide layer.

Next, the oxidation barrier, typically comprising silicon nitride over a thin layer of stress relief silicon oxide, is removed with wet etching and the field oxide is etched back to to reveal the silicon surface in the bird's beak region as well as to obtain improved planarity. The result is shown in FIG. 3. The partial etch of silicon oxide 14 results in the formation of thermally grown silicon oxide portions 14a disposed around the active region of the device. It is noted that partial etching is sufficient to expose at least a portion of the sloped boundary which exists between the oxide 14 and silicon 10 in FIG. 2. It is the treatment of this exposed sloped region which is most important to the practice and understanding of the present invention. Typically, the silicon nitride is etched using a solution of phosphoric acid at a temperature of about 180° C. Furthermore, in accordance with known methods for etching silicon oxide, a solution containing hydrofluoric acid is generally employed. Typically useful solutions for the removal of silicon oxide include HF at a concentration of approximately 5% by weight.

Figure 4:
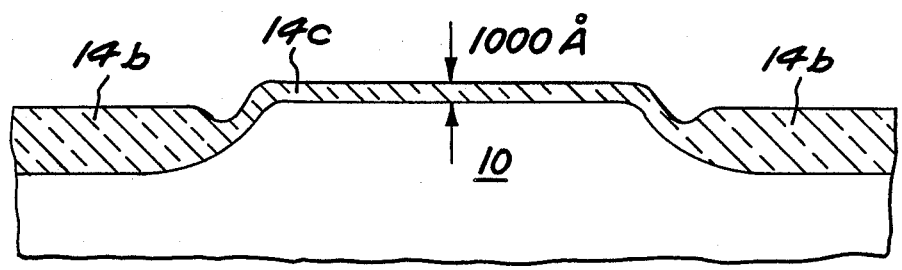
FIG. 4 is a view similar to FIG. 3, but more particularly illustrating the result occurring upon the formation of an additional relatively thin thermally grown oxide layer.

Next, a thin thermally grown oxide layer 14c is formed so as to now form a continuous silicon oxide structure as seen in FIG. 4. This layer is preferably approximately 1,000 angstroms thick. However, in general, it may be between 100 angstroms and 2,000 angstroms in thickness. It is formed in the same way as oxide 14 seen in FIG. 2 although the time of exposure is reduced to accommodate its desired thickness. This thin layer of thermally grown silicon oxide is in particular seen to cover the sloping sidewalls of the bird's beak in the active region. Next, a thick layer of deposited silicon oxide 16 is formed. This layer is preferably approximately 2,000 angstroms thick and in general, it is preferred that this relatively thick deposited oxide layer be generally twice as thick as the underlying layer of thermally grown silicon oxide on top of the active area. Oxide layer 16 is deposited by chemical vapor deposition. Deposited oxide layer 16 is also preferably densified to serve as an oxide seal over the thin sidewall oxide in the bird's beak and active areas.

Figure 6:
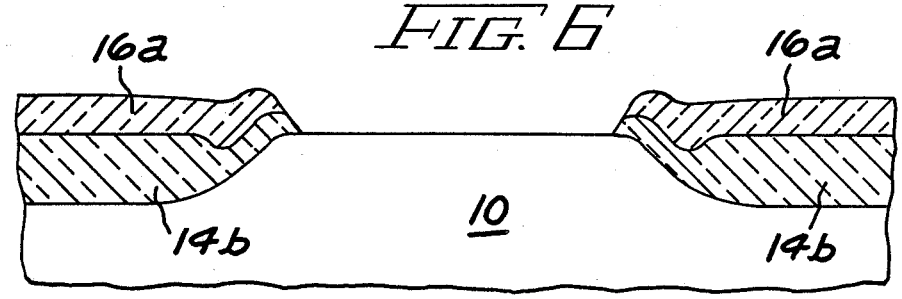
FIG. 6 is a cross-sectional side elevation view similar to that shown in FIG. 5, but more particularly illustrating the effects of masking and etching silicon oxide layers above the active region.
Figure 7:
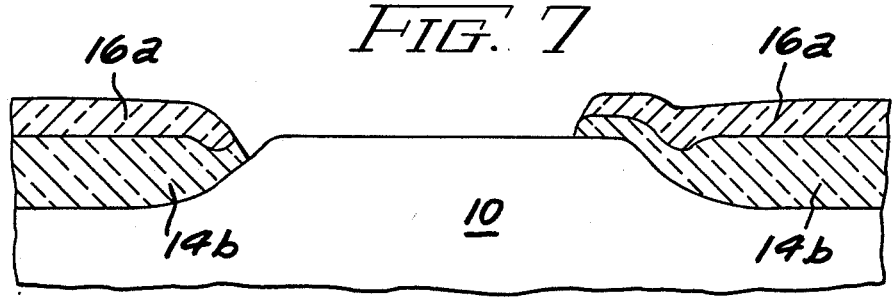
FIG. 7 is a cross-sectional side elevation view similar to that shown in FIG. 6, but more particularly illustrating process tolerance to mask misalignment.

Next, the thick deposited and thin thermally grown oxide layers 16 and 14c are removed from the active area. Patterning of this oxide seal is accomplished with a darkfield, active area mask which is slightly undersized from the nominal value. Reactive ion etching of the oxide sandwich overlying the active regions is preferably stopped short of the silicon surface to avoid reactive ion etching damage to active silicon areas. A final wet etch of the remaining thermal oxide (typically approximately 500 angstroms) is carried out to uncover the active silicon area. This provides tapered seal edges in the periphery of the active areas, as desired. The resulting structure is shown in FIG. 6. The structure is particularly characterized in that the bird's beak region includes a thin layer of field oxide which is thermally grown and also a thicker layer of field oxide which is deposited. It is this structure which reduces the sensitivity of the device to radiation conditions. It is also noted that in the particular structure shown in FIG. 6, the thermally grown oxide is tapered to a thin layer in the region of the bird's beak. It is further noted that while both of the insulation layers in the bird's beak region are described as comprising silicon oxide, there are in fact two layers which are present which is evidenced by the fact that the etch rate for deposited silicon oxide is higher than the etch rate for thermally grown silicon oxide. The process of the present invention is also at least somewhat immune to mask alignment errors in the etching of the dual layer oxide. Thus, the structure illustrated in FIG. 7, though less symmetrical, still functions as a suitable structure from which a field effect transistor can be produced.

While the description above generally describes the preferred embodiment of the present invention, it is noted that other variations are possible. In particular, it is noted that the oxidation barrier may comprise materials other than silicon nitride over a stress relief layer of silicon oxide. In particular, it is also possible to employ polycrystalline silicon. Furthermore, it is possible to employ a layered oxidation barrier structure in which the upper layers comprise either silicon nitride or polycrystalline silicon. In one embodiment, it is possible to employ an underlying layer of stress relief oxide having a thickness of approximately 200 angstroms over which is disposed a layer of polycrystalline silicon which is approximately 550 angstroms thick and over which is deposited a layer of silicon nitride which is approximately 1,500 angstroms in thickness. However, the lower layer of the oxidation barrier should include a thin layer of silicon oxide for stress relief.

Figure 5:
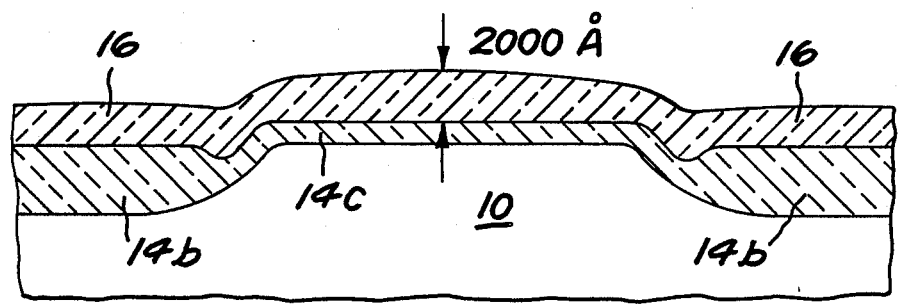
FIG. 5 is a cross-sectional side elevation view similar to FIG. 4, but more particularly showing the effects occurring as the result of the deposition of a relatively thick layer of deposited silicon oxide.

Another variation of the method and structure of the present invention includes the deposition of a thin silicon nitride layer between layers 16 and 14c in FIG. 5. Additionally, it is also possible to employ a thick layer of silicon nitride in place of the relatively thick layer of deposited silicon oxide. However, this is not a preferred embodiment of the present invention because of the increased possibility of strain between nitride and oxide layers arising particularly as a result of thermal conditions.

In the present invention, it is generally desirable that the thin layer of thermally grown oxide shown as layer 14c in FIG. 5 be as thin as possible. However, it is not desired that this layer be so thin as to permit the possibility of contaminant migration from deposited oxide layer 16.

It is furthermore pointed out that in general, thick field oxide regions 14 as shown in FIG. 2 are typically approximately 10,000 angstroms thick. After partial etching, silicon oxide regions 14a in FIG. 3 are typically approximately 3,000 angstroms to 4,000 angstroms in thickness. It should also be noticed that throughout the process steps illustrated in FIGS. 3-5, substantial planarity is preserved.

From the above, it should be appreciated that the method and structure of the present invention is particularly desirable for field oxide isolation in field effect transistor devices. It is seen that the method of the present invention is simple and does not employ difficult or esoteric processing techniques. It is also seen that the present invention results in the formation of silicon oxide layers exhibiting different properties which enhance radiation hardness. Furthermore, the processing of the present invention produces these desired structures without sacrificing planarity of the device. In particular, it is seen that the present invention preferably employs a tapered layer of thermally grown silicon oxide over which is disposed a layer of deposited oxide. The thermal oxide is generally thinner than the deposited oxide in the bird's beak region of a field effect transistor device made in accordance with the present invention. However, more distally from the active region plateau, the reverse is true with the deposited oxide being thicker. It is noted though that, within limits, the relative thickness of these layers in the bird's beak region does not affect the radiation hardness provided by the present invention. It is further seen that the objects of the present invention are achieved without processing complexity and without the necessity of employing mask alignment and processing steps which are more critical than is otherwise required.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A field isolation structure for field effect transistors, said structure comprising:
    a doped silicon plateau region exhibiting a raised, substantially planar central region having a sidewall sloping downwardly away from said central region;
    a layer of thermally grown silicon oxide surrounding said central region and including at least a portion extending onto said central region, said oxide layer being tapered in the direction of said sloping sidewall; and
    a layer of deposited silicon oxide disposed over and in contact with said thermally grown silicon oxide at least along substantially most of said sidewall and extending, along said portion of said thermally grown silicon oxide, to said central region.

2. The structure of claim 1 in which said thermally grown silicon oxide on said sidewall is between approximately 100 and 2,000 angstroms in thickness.

3. The structure of claim 1 in which said deposited silicon oxide layer is approximately 2,000 angstroms in thickness.

4. The structure of claim 1 in which said deposited silicon oxide layer is approximately twice as thick as said layer of thermally grown silicon oxide in the region of said sloping sidewall.

5. A silicon field effect transistor structure having an active area and a bird's beak region surrounding said active area, said bird's beak region including a silicon substrate and field isolation silicon oxide in direct contact with said substrate in said bird's beak region, a thin layer of thermally grown silicon oxide formed on said field isolation silicon oxide and extending into the periphery of said active area, and a thick layer of deposited silicon oxide on said thin layer of thermally grown silicon oxide, said thick layer being approximately twice as thick as said thin layer in said bird's beak region.

* * * * *